United States Patent
Kim et al.

[11] Patent Number: 6,147,385
[45] Date of Patent: Nov. 14, 2000

[54] CMOS STATIC RANDOM ACCESS MEMORY DEVICES

[75] Inventors: Sung-Bong Kim, Suwon-shi; Ki-Joon Kim, Seoul; Jong-Mil Youn, Songnam-shi, all of Rep. of Korea

[73] Assignee: Samsung Electronics Co., Ltd., Rep. of Korea

[21] Appl. No.: 09/218,819

[22] Filed: Dec. 22, 1998

[30] Foreign Application Priority Data

Dec. 23, 1997 [KR] Rep. of Korea ...................... 97-72550

[51] Int. Cl.[7] .......................... H01L 29/76; H01L 29/94; H01L 31/062
[52] U.S. Cl. .......................... 257/369; 257/385; 257/903; 257/390; 365/156
[58] Field of Search .................................... 257/903, 369, 257/385, 351, 377, 382, 390, 368, 393; 365/156, 182, 180

[56] References Cited

U.S. PATENT DOCUMENTS

| | | | |
|---|---|---|---|
| 5,373,170 | 12/1994 | Pfiester et al. .............................. | 257/69 |
| 5,394,358 | 2/1995 | Huang ...................................... | 365/185 |
| 5,521,860 | 5/1996 | Ohkubo .................................... | 365/154 |
| 5,654,572 | 8/1997 | Kawase .................................... | 257/371 |
| 5,798,551 | 8/1998 | Kikushina et al. ...................... | 257/368 |

FOREIGN PATENT DOCUMENTS

| | | | |
|---|---|---|---|
| 3-11734 | 1/1991 | Japan ..................................... | 257/903 |

*Primary Examiner*—Donald L. Monin, Jr.
*Attorney, Agent, or Firm*—Samuels, Gauthier & Stevens LLP

[57] ABSTRACT

A full CMOS SRAM cell having the capability of having a reduced aspect ratio is described. The SRAM cell includes first and second transfer transistors of n-channel types, first and second driving transistors of the n-channel types and first and second load transistors of p-channel types. Each of the transistors has source and drain regions on opposite sides of a channel region formed in a semiconductor substrate and a gate over the channel region. The cell includes a first common region defined by the drain regions of the first transfer transistor and the first driving transistor connected in series therethrough. A second common region is defined by the drain regions of the second transfer transistor and the second driving transistor connected in series therethrough. The drain region of the first load transistor is disposed adjacent to the first common region between the first and second common regions. The drain region of the second load transistor is disposed between the drain region of the first load transistor and the second common region. First and second gate electrode layers are disposed generally parallel to each other, and respectively serving as the gates of the first driving transistor and the first load transistor and as the gates of the second driving transistor and the second load transistor, wherein each of the first and second gate electrode layers is made of a conductive material of a first level. First and second interconnecting layers are each made of a conductive material of a second level different from the first level, the first interconnecting layer connecting the first common region to the drain region of the first load transistor and the second gate electrode layer, the second interconnecting layer connecting the second common region to the drain region of the second load transistor and the first gate electrode layer.

23 Claims, 11 Drawing Sheets

CMOS STATIC RANDOM ACCESS MEMORY DEVICES

FIELD OF THE INVENTION

The present invention relates to semiconductor memory devices, and in particular, to CMOS static random access memory(SRAM) devices.

BACKGROUND OF THE INVENTION

A conventional SRAM cell is comprised of first and second driving transistors whose drain-source paths are respectively connected between first and second storage nodes and ground, first and second load elements connected between the first and second storage nodes and power supply, respectively, first and second switching transistors whose drain-source paths are respectively connected between the first and second storage nodes and a pair of data lines (or bit lines). Gates of the first and second driving transistors are connected to the second and first storage nodes, respectively, and gates of the first and second switching transistors are connected to a word line.

SRAM cells may generally be classified according to the manufacturing configuration of the load elements used in the cells. A high resistance SRAM cell uses as load elements layers of high-resistance material such as polycrystalline silicon (typically called "polysilicon") on an insulating layer over a semiconductor substrate in which the first and second driving transistors and the first and second switching transistors are formed. A thin-film SRAM cell uses as load elements thin-film transistors on an insulating layer over the semiconductor substrate on which the four transistors are formed. In a CMOS SRAM cell, first and second load transistors complementary to the first and second driving transistors are formed on the semiconductor substrate together with the other transistors. The CMOS SRAM cell is generally called a full CMOS SRAM cell.

The full CMOS SRAM cell has various advantages of lower standby current, higher operating speed, greater operational stability, greater alpha-particle immunity at a low power supply voltage, as compared with the high resistance and thin-film transistor SRAM cells. As a result, the full CMOS SRAM cell may be widely used in the fields of cache memory for personal computers, nonvolatile buffer memory for direct access storage devices and storage devices for logic LSI and microprocessors. However, a drawback to the full CMOS SRAM cell is that its area is too large to realize a high-density SRAM.

One prior art approach to reducing the cell area in a full CMOS SRAM cell is disclosed in U.S. Pat. No. 5,521,860. This SRAM cell includes first and second driving transistors, first and second load transistors and first and second switching transistors which are respectively arranged symmetrical with respect to a center point in a cell region. The first and second driving transistors and the first and second switching transistors are of n-channel type, and the first and second load transistors are of p-channel type. First and second word lines serving as gate electrodes of the first and second switching transistors are arranged parallel to each other. A first intra-cell connection serving as gate electrodes of the first driving transistor and the first load transistor is connected to drain regions of the second driving transistor and the second load transistor, and a second intra-cell wiring serving as gate electrodes of the second driving transistor and the second load transistor is connected to drain regions of the first driving transistor and the first load transistor. The first and second intra-cell wirings are arranged parallel to each other between the first and second word lines so as to be perpendicular to the word lines. Two ground connections connected to source regions of the first and second driving transistors and a power supply connection connected to source regions of the first and second load transistors are arranged over the word lines and the first and second intra-cell wirings interposing an insulating layer.

However, since the first and second intra-cell wirings and the first and second word lines are arranged at the same level, and the first and second intra-cell wirings are spaced apart so as to be perpendicular to the first and second word lines and to be arranged between the first and second word lines, this prior SRAM cell has a large aspect ratio, i.e., the ratio of longitudinal length to lateral length of cell region. Therefore, a length of each of the bit lines perpendicular to the word lines increases, thereby increasing resistance and parasitic capacitance of each of the bit lines. This problem hinders reading and writing data from and into the memory cell at high speed.

Furthermore, since two ground connections and a power supply connection therebetween are arranged on the insulating layer, reducing the longitudinal length of the cell decreases a width of each of the ground and power supply connections, thereby causing the resistance of each connection to increase. This can result in malfunction of the cell during reading or writing operation due to the voltage drop caused by the increase in resistances of the connections. Therefore, the extent to which the cell size can be scaled down is limited.

SUMMARY OF THE INVENTION

An object of the present invention is to provide a semiconductor device having a reduced aspect ratio compared to prior full CMOS SRAM cells.

Another object of the present invention is to provide a semiconductor memory device capable of sufficiently enlarging the width of each of ground and power supply connections so as to prevent voltage drop thereof.

The present invention is directed to a static random access memory cell including first and second transfer transistors of the n-channel type, first and second driving transistors of the n-channel type and first and second load transistors of p-channel type, each of the transistors having source and drain regions on opposite sides of a channel region formed in a semiconductor substrate and a gate over the channel region. The cell includes a first common region defined by the drain regions of the first transfer transistor and the first driving transistor connected in series therethrough. A second common region is defined by the drain regions of the second transfer transistor and the second driving transistor connected in series therethrough. The drain region of the first load transistor is disposed adjacent to the first common region between the first and second common regions. The drain region of the second load transistor is disposed between the drain region of the first load transistor and the second common region. First and second gate electrode layers are disposed generally parallel to each other, and serve as the gates of the first driving transistor and the first load transistor, respectively, and as the gates of the second driving transistor and the second load transistor, respectively. Each of the first and second gate electrode layers is made of a conductive material at a first level of the memory cell, and first and second interconnecting layers are made of a conductive material at a second level different from the first level. The first interconnecting layer connects the first common region to the drain region of the first load transistor and the second gate electrode layer. The second interconnecting layer connects the second common region to the drain region of the second load transistor and the first gate electrode layer.

The memory cell also includes isolation regions formed in the substrate and first and second active regions seperately formed in the substrate such as to be isolated by the isolation regions, each of the first and second active regions extending in a first direction. The first active region provides the source and channel regions and the first common region of the first transfer transistor and the first driving transistor. The second active region provides the source and channel regions and the second common region of the second transfer transistor and the second driving transistor. Third and fourth active regions are seperately formed in the substrate so as to be isolated by the isolation regions.

The third active region extends from the drain region of the first load transistor in the first direction to provide the drain, channel and source regions of the first load transistor. The fourth active region extends to the drain region of the second load transistor in the first direction to provide the source, channel and drain regions of the second load transistor. In one embodiment, each of the first and second active regions is a p-well region formed in the substrate, and each of the third and fourth regions is an n-type well region formed in the substrate.

In one embodiment, the first and second gate electrode layers extend in a second direction which is generally perpendicular to the first direction. An end portion of the first gate electrode is positioned adjacent to the drain region of the second load transistor. An end portion of the second gate electrode is positioned adjacent to the drain region of the first load transistor. In one embodiment, the first gate electrode layer is disposed generally symmetrically with respect to the second gate electrode relative to an axis. The first interconnecting layer can also be disposed generally symmetrically with respect to the second interconnecting layer relative to an axis. The first transfer transistor, the first driving transistor and the first load transistor can be disposed generally symmetrically with respect to the second transfer transistor, the second driving transistor and the second load transistor, respectively, relative to an axis in the substrate.

In another aspect, the invention is directed to a semiconductor memory device which includes at least one memory cell disposed in a cell region defined on a semiconductor substrate. The cell includes first and second transfer transistors, first and second driving transistors and first and second load transistors, each of which has a pair of source/drain regions on opposite sides of a channel region in the substrate and a gate over the channel region. One of the source/drain regions of the first transfer transistor is connected in series with one of the source/drain regions of the first driving transistor to provide a first common region. One of the source/drain regions of the second transfer transistor is connected in series with one of the source/drain regions of the second driving transistor to provide a second common region. The first common region is connected to one of the source/drain regions of the first load transistor and to the gates of the second load transistor and the second driving transistor. The second common region is connected to one of the source/drain regions of the second load transistor and to the gates of the first load transistor and the first driving transistor. The other of the source/drain regions of each of the first and second transfer transistors is connected to a corresponding one of a pair of data lines. The memory also includes a first active region formed in the substrate in the cell region and extending in a first direction to provide the others of the source/drain regions of the first transfer transistor and the first driving transistor, the channel regions thereof and the first common region. A second active region is formed spaced apart from the first active region in the substrate in the cell region and extending in the first direction to provide the others of the source/drain regions of the second transfer transistor and the second driving transistor, the channel regions thereof and the second common region.

The device can also include a third active region formed in the substrate in the cell region and disposed adjacent the first active region between the first and second active regions and extending in the first direction to provide the source/drain regions and the channel region of the first load transistor. A fourth active region can be formed in the substrate in the cell region and disposed adjacent the second active region between the first and second active regions and extending in the first direction to provide the source/drain regions and the channel region of the second load transistor.

In one embodiment, the cell region is a generally rectangular-shaped region having first and second edges substantially parallel to a second direction substantially perpedicular to the first direction. Third and fourth edges are substantially parallel to the first direction. A first end portion of the other of the source/drain regions of the first driving transistor is contigious to the first edge, and a second end portion of the other of the source/drain regions of the second driving transistor is contiguous to the second edge.

In one embodiment, a first bridge region is formed in the substrate in the cell region and extends to the third edge adjacent the first active region along the first edge from the first end portion. A second bridge region is formed in the substrate in the cell region and extends to the fourth edge adjacent the second active region along the second edge from the second end portion. A ground connection layer can be formed on an insulating layer over the cell region and connected to the first and second bridge regions underlying the insulating layer through contact holes.

In another aspect, the invention is directed to a semiconductor device including memory cells formed in cell regions on a semiconductor substrate. The cell regions are defined by row and column lines bounding the cell regions. The row lines are divided into alternative first and second row lines, and the column lines are divided into alternate first and second column lines. Each of the cells includes a flip-flop with cross-coupled first and second inverters. First and second transfer transistors are connected to the flip-flop. The first and second inverters have first and second diffusion regions, respectively, in the substrate to be connected to a ground source. The device also includes first bridge regions formed in the substrate such that each of the first bridge regions is interconnected through a corresponding one of intersections of the first row lines and the first column lines with the first diffusion region in each of four cell regions contiguous to the corresponding one of the intersections thereof. Second bridge regions are formed in the substrate such that each of the second bridge regions is interconnected through a corresponding one of intersections of the second row lines and the second column lines with the second diffusion region in each of four cell regions contiguous to the corresponding one of the intersections thereof. The second bridge regions crossing each of the second row lines are arranged in a staggered relationship with respect to the first bridge regions crossing each of two first row lines adjacent to each of the second row lines.

In one embodiment, the first diffusion region of each cell is a source region of a first driving transistor of an n-type constituting the first inverter, and the second diffusion region of each cell is a source region of a second driving transistor of n-channel type constituting the second inverter. In one embodiment, the first and second inverters of each cell respectively include third and fourth diffusion regions formed in the substrate to be connected to a power supply source. The third diffusion regions in the cell region contiguous to each of the first column lines are disposed in rectilinear relationships generally parallel in a row direction on opposite sides of each of the first column lines. The fourth diffusion regions in the cell regions contiguous to each of the second column lines are disposed in rectilinear relationships generally parallel in the row direction on opposite sides of each of the second column lines.

The semiconductor device can also include ground layers extending in a column direction on an insulating layer over the memory cells arranged in each of alternating columns and connected to the first and second bridge regions via contact holes in the insulating layer for supplying the ground source. Power supply layers can be included extended in the column direction on the insulating layer over the memory cells arranged in each column between the alternating columns and connected to the third and fourth diffusion regions via contact holes in the insulating layer for supplying the power supply source. In one embodiment, the contact holes for supplying the ground source are disposed at the intersections and the contact holes for supplying the power source are disposed at portions on the first column lines intersecting with the rectilinear third diffusion regions and on the second column lines intersecting with the rectilinear fourth diffusion regions.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention

DETAILED DESCRIPTION OF PREFERRED EMBODIMENTS

In accordance with one embodiment of the present invention, a full CMOS SRAM cell is described referring to the accompanying drawings. In the following description, numerous specific details are set forth, such as specific energy levels, thicknesses, conductive types and so on, in order to provide a thorough understanding of the present invention. However, it will be understood by those skilled in the art that these specific details are not required to practice the invention. For example, n-channel type transistors may be used instead of p-channel type transistors, and vice versa.

Figure 1:
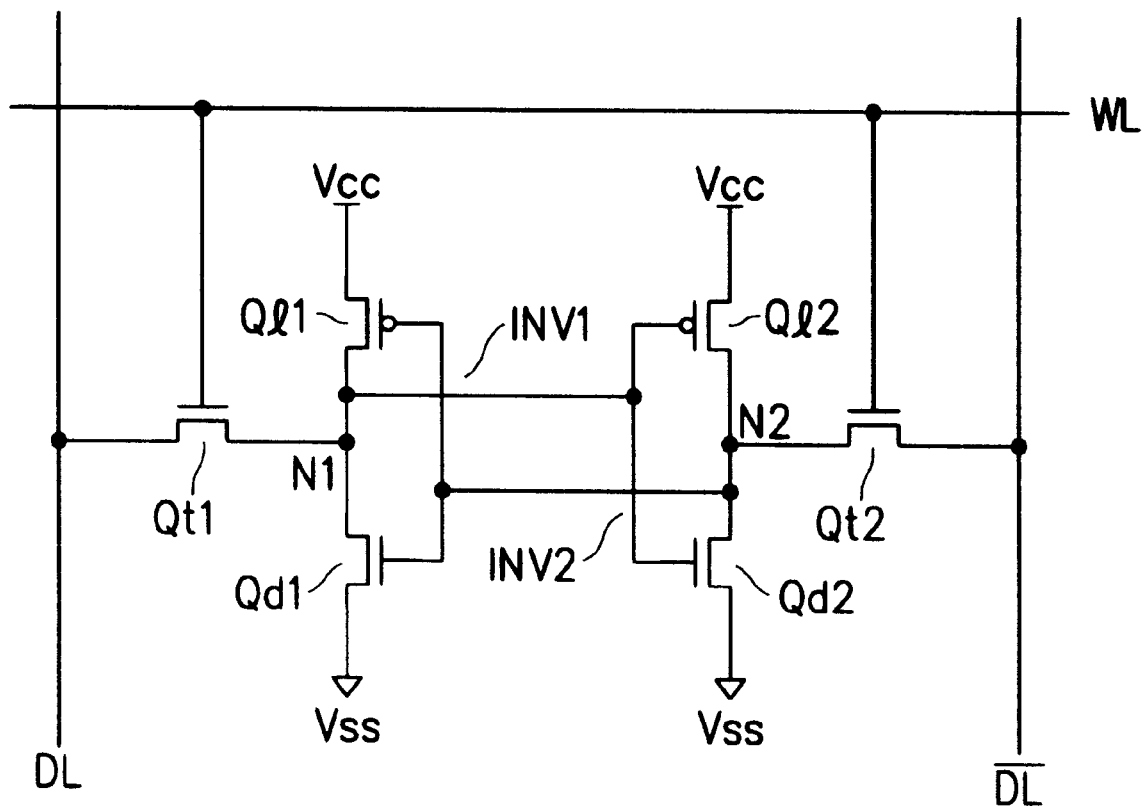
FIG. 1 is an equivalent circuit diagram of a full CMOS SRAM cell according to the present invention.
Figure 3:
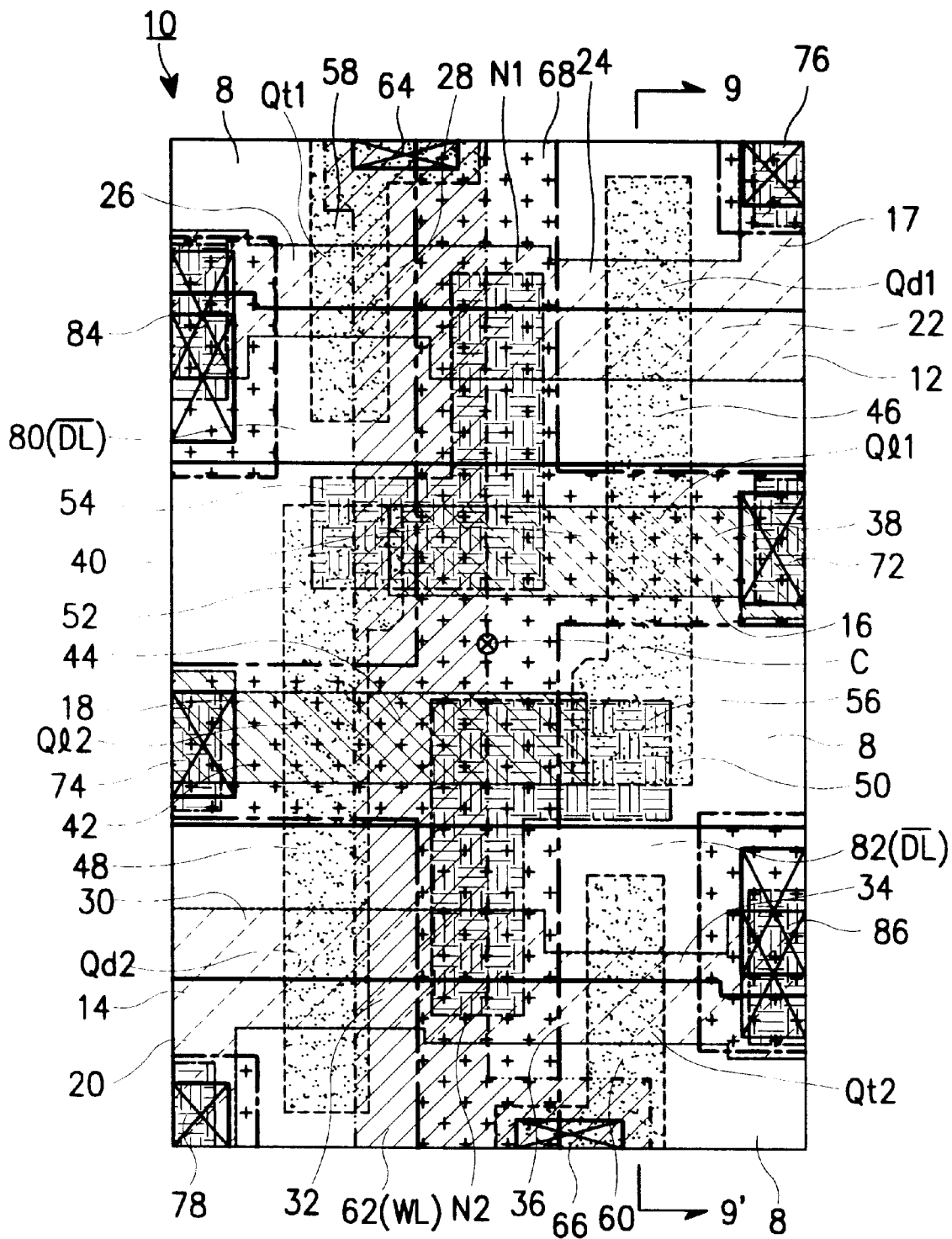
FIG. 3 contains a plan view showing a single cell according to the present invention.

FIG. 3 is an enlarged plan view showing a layout diagram of a single CMOS SRAM cell according to one embodiment of the present invention, and FIG. 1 is a circuit diagram of FIG. 3.

Referring to FIGS. 1 and 3, the CMOS SRAM cell is comprised of a flip-flop having cross-coupled first and second inverters INV1 and INV2, and first and second transfer transistors Qt1 and Qt2 coupled to the flip-flop. The first inverter INV1 includes a first load transistor Q11 and a first driving transistor Qd1 and the second inverter INV2 includes a second load transistor Q12 and a second driving transistor Qd2. First and second transfer transistors Qt1 and Qt2 and first and second driving transistors Qd1 and Qd2 are first conductivity-type channel, i.e., n-channel, insulated gate field effect transistors, and first and second load transistors Q11 and Q12 are second conductivity-type channel, i.e., p-channel, insulated gate field effect transistors. First and second inverters INV1 and INV2 include not only first and second diffusion regions, i.e., source regions, of first and second driving transistors Qd1 and Qd2, which are connected to a ground source (or ground voltage Vss), but also third and fourth diffusion regions, i.e., source regions, of first and second load transistors Q11 and Q12, which are connected to a power supply source (or power supply voltage Vcc).

A cell region 10 on a semiconductor substrate has a rectangular shape of 2.0×3.2 $\mu m^2$ according to one exemplary embodiment of the present invention. First and second active regions 12 and 14 are formed in the substrate, elongatedly extending to a row direction. The first active region 12 has a portion 17 extending to an upper side edge along a right side edge, and the second active region 14 has a portion 20 extending to a lower side edge along a left side edge. Source and drain regions 22 and 24 of the first driving transistor Qd1 and a channel region therebetween and source and drain regions 26 and 28 of the first transfer transistor Qt1 and a channel region therebetween are formed in the first active region 12. The drain region 28 of the first transfer transistor Qt1 is coupled in common through the drain region 24 of the first driving transistor Qd1 and a first storage node region N1. In a similar manner, source and drain regions 30 and 32 of the second driving transistor Qd2 and a channel region therebetween and source and drain regions 34 and 36 of the second transfer transistor Qt2 and a channel region therebetween are formed in the second active region 14. The drain region 36 of the second transfer transistor Qt2 is coupled in series through the drain region 32 of the second driving transistor Qd2 and a second storage node region N2.

A third active region 16 is formed in the substrate, extending to the row direction so as to be adjacent to the first active region 12 between the first and second active regions 12 and 14. Source and drain regions 38 and 40 of the first load transistor Q11 and a channel region therebetween is formed in the third active region 16. Source and drain regions 38 and 40 and the channel region of the first load transistor Q11 are respectively aligned in a column direction with source and drain regions 22 and 24 and the channel region of the first driving transistor Qd1.

A fourth active region 18 is formed in the substrate, extending to the row direction so as to be adjacent to the second active region 14 between the first and second active regions 12 and 14. In the fourth active region 18, source and drain regions 42 and 44 of the second load transistor Q12 and the channel region therebetween are formed so as to be aligned in the column direction with source and drain regions 30 and 32 of the second driving transistor Qd2 and the channel region therebetween.

The first to fourth active regions 12, 14, 16 and 18 are isolated by isolation regions 8. Since the first to fourth active regions 12, 14, 16, 18 extend in the row direction adjacent to one another in the cell region 10 as described above, the present invention has an advantage that it is capable of reducing the aspect ratio, as compared with prior devices. Source, drain and channel regions of first driving transistor Qd1, first transfer transistor Qt1 and first load transistor Q11 are also arranged to be substantially symmetrical with source, drain and channel regions of second driving transistor Qd2, second transfer transistor Qt2 and second load transistor Q12 with respect to a center axis C, respectively. Therefore, storage states of charges stored in the first and second storage node regions N1 and N2 are stable.

A first gate electrode layer 46 elongatedly extends in the column direction interposing gate oxide layers on the channel regions of first driving transistor Qd1 and first load transistor Q11. Similarly, a second gate electrode layer 48 elongatedly extends in the column direction interposing gate oxide layers on the channel regions of second driving transistor Qd2 and second load transistor Q12. A third gate electrode layer 58 extends in the column direction over the channel region of the first transfer transistor Qt1 through a gate oxide layer thereof so as to be arranged in contact with the upper side edge of the cell region 10. A fourth gate electrode layer 60 extends in the column direction interposing a gate oxide layer on the channel region of the second transfer transistor Qt2 so as to be arranged in contact with the lower side edge of the cell region 10. Each of the first to fourth gate electrode layers 46, 48, 58 and 60 is a conductive layer of a first level made of a same material. One end portion 50 of the first gate electrode layer 46 overlies the isolation region 8 so as to overlap an end portion of the drain region 44 of the second load transistor Q12. The end portion 50 may be laterally adjacent to the end portion of the drain region 44. Similarly, one end portion 52 of the second gate electrode layer 48 overlies the isolation region 8 so as to overlap an end portion of the drain region 40 of the first load transistor Q11. The end portion 52 may be laterally adjacent to the end portion of the drain region 40. The first and third gate electrode layers 46 and 58 are arranged in substantial symmetry with the second and fourth gate electrode layer 48 and 60 with respect to the center axis C, respectively.

A first connection layer 54 has an L-shape in order to interconnect the first storage region N1 with the drain region 40 of the first load transistor Q11 and the second gate electrode layer 48. A second connection layer 56 has an L-shape so as to interconnect the second storage region N2 with the drain region 44 of the second load transistor Q12 and the first gate electrode layer 46. Each of the first and second connection layers 54 and 56 is a conductive layer made of a same material. The first connection layer 54 is also arranged in substantial symmetry with the second connection layer 56 with respect to the center axis C.

A word line layer 62 (or WL) elongatedly extends in the column direction on a first inter-level insulating layer. The word line layer 62 is coupled to the third and fourth gate electrode layers 58 and 60 through a half contact hole 64 located at the upper edge and a half contact hole 66 located at the lower edge. A second inter-level insulating layer is deposited on the word line layer 62 and the first inter-level insulating layer. As described below, a ground connection layer and power supply connection layer are alternately arranged on the second inter-level insulating layer. The power supply connection layer 68 is represented in the FIG. 3. The layer 68 is coupled to the source region 38 of the first load transistor Q11 through a half contact hole 72 located at the right side edge and to the source region 42 of the second load transistor Q12 through a half contact hole 74 located at the left side edge.

A quarter contact hole 76 is located at the upper right edge and is connected to the ground connection layer contiguous to the right side edge in order to provide the ground source to the source region 22 of the first driving transistor Qd1. A quarter contact hole 78 is located at the lower left side edge and is connected to the ground connection layer contiguous to the left side edge in order to provide the ground source to the source region 30 of the second driving transistor Qd2.

A third inter-level insulating layer is deposited on the power supply connection layer 68, ground connection layer and second inter-level insulating layer. A pair of data lines 80 (or DL) and 82 (or DL) are elongatedly formed to extend in the row direction on the third inter-level insulating layer. The data lines 80 and 82 are in complementary relationship with each other. The data line 80 is connected to the source region 26 of the first transfer transistor Qt1 through a half contact hole 84 located at the right side edge, while the data line 82 is connected to the source region 34 of the second transfer transistor Qt2 through a half contact hole 86 located at the left side edge.

Figure 2A:
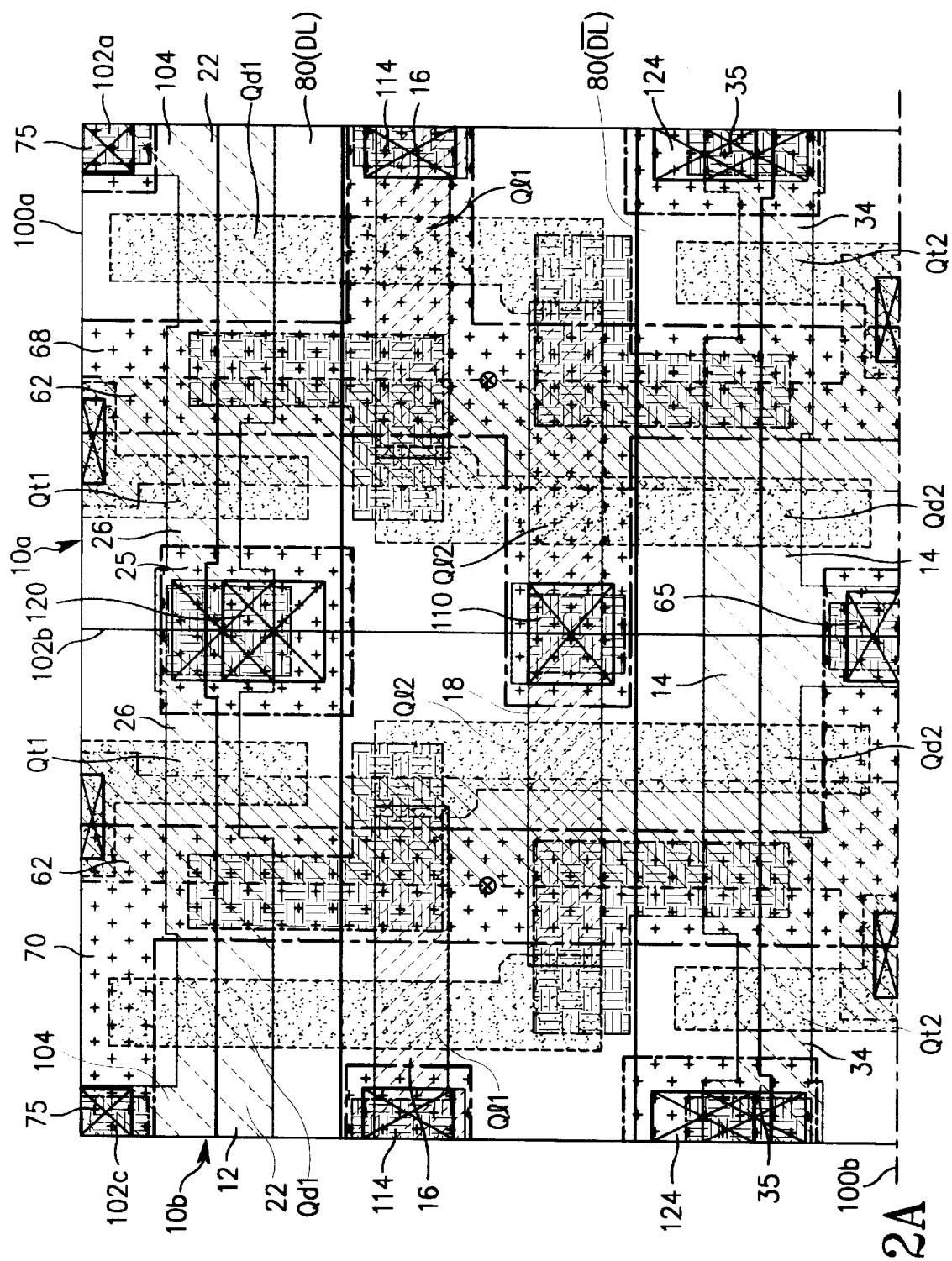
FIGS. 2A and 2B contain plan views showing four contiguous cells according to the present invention.
Figure 2B:
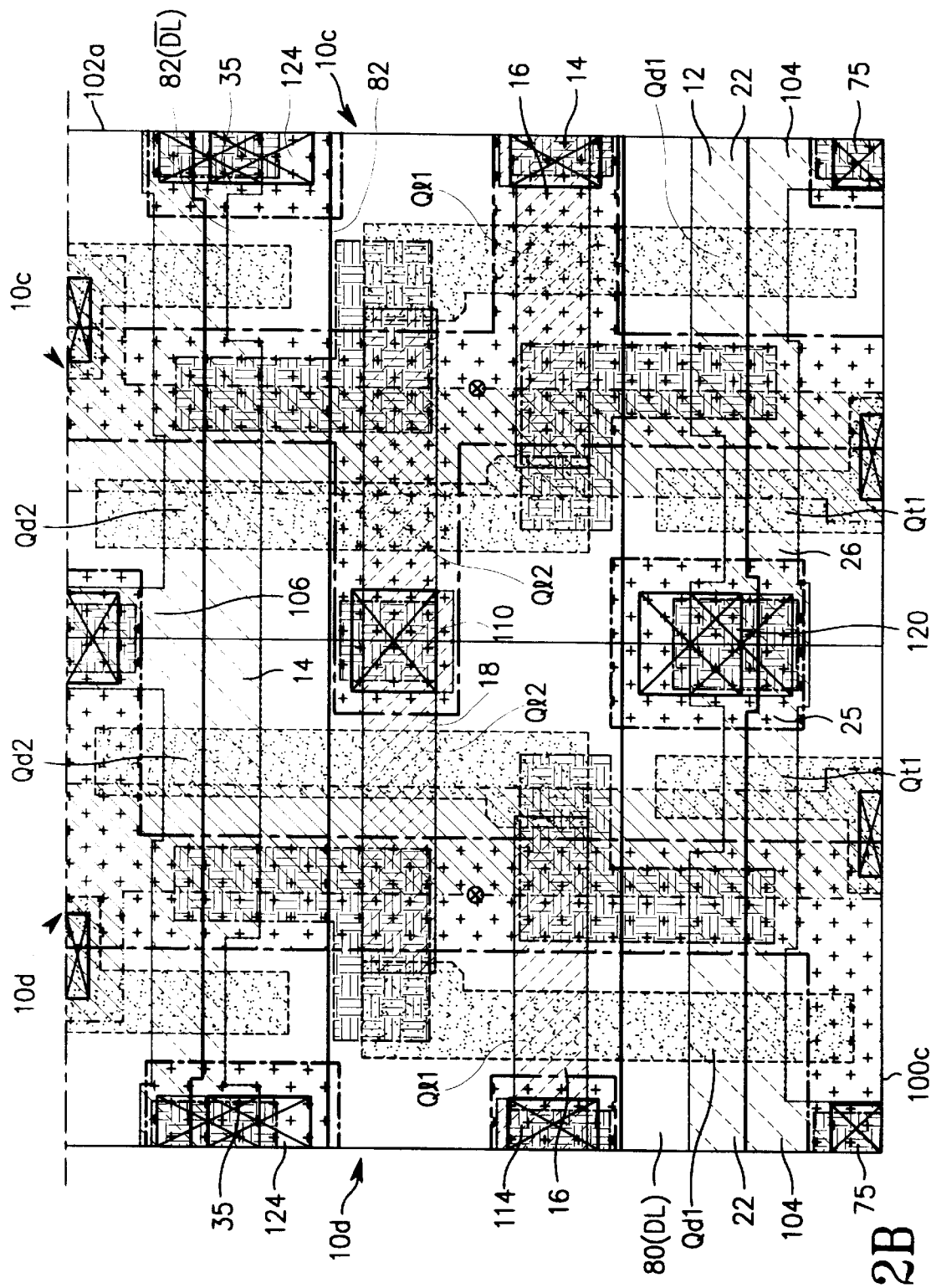

FIGS. 2A and 2B show an enlarged plan view of four contiguous cells with their combination. The upper right side cell region 10a of FIG. 2A is the same as the cell region of FIG. 3.

Referring to FIGS. 2A and 2B, four cell regions 10a to 10d are defined by row lines 100a, 100b and 100c and column lines 102a, 102b and 102c. For the convenience of illustration, although four adjacent cells are shown, it should be noted that a multiplicity of four adjacent cells are arranged in rows and columns so as to be contiguous to one another. Therefore, cell regions are defined by a multiplicity of row and column lines bounding memory cells. The row lines are divided into alternate first and second row lines, and the column lines are divided into alternate first and second column lines. A pair of first active regions are arranged at both sides of each of first row lines, and a pair of second active regions are arranged at both sides of each of second row lines.

The cell region 10b is substantially symmetrical with the cell region 10a with respect to the column line 102b. The cell region 10c is substantially symmetrical with the cell region 10a with respect to the row line 10b. The cell region 10d is substantially symmetrical with the cell region 10a with respect to the intersection point of row line 100b and column line 102b. Therefore, a pair of first active region 12 are arranged to extend in the row direction at opposite sides of each of the first row lines 100a and 100c (first active regions at the upper portion of the line 100a and the lower portion of the line 100c are not shown in the drawing). A pair of second active regions 14 are also arranged to extend in the row direction at opposite sides of the second row line 10b. First bridge regions 104 are formed in the substrate to pass intersection points of first column lines 102a and 102c and first row lines 100a and 100c along the first column lines 102a and 102c in order to interconnect adjacent first active regions 12 of the first active region pairs. Similarly, a second bridge region 106 is formed in the substrate to pass an intersection point of the second column line 102b and the second row line 100b along the second column line 102b in order to interconnect the pair of second active regions 14. Therefore, second bridge regions 106 on the second row line 100b are arranged in alternate relationship with the first bridge regions 104 on the first row line 100a or 100c.

Therefore, the ground connection layer 70 connected to the second bridge region 106 through the contact hole 65 is connected to the source regions (or the second ground regions) 14 of the second driving transistors Qd2 of four contiguous cells. Since the second bridge region 106 shares the source regions 14 of the second driving transistors Qd2 of four contiguous cells, each of the four contiguous cells uses a quarter of the contact hole 65 on the second bridge region 106. Similarly, each of the first bridge regions 104 on the first row lines 100a and 100c shares source regions (or first ground regions) 22 of the first driving transistors Qd1 of the four contiguous cells. Therefore, each of the four contiguous cells uses a quarter of the contact hole 75 on each first bridge region 104. Therefore, the number of contact holes may be reduced.

As a result, the contact holes 75 and 65 for the ground connection are located at cross-points of the first row lines and the first column lines as well as the second row lines and the second column lines. The contact holes 75 and 65 on two adjacent row lines are arranged in alternate relationship with one another. The ground connection layer 70 is connected to the first and second bridge regions 104 and 106 through the contact holes 75 and 65.

The source regions 16 of two adjacent first load transistor Q11 are located on opposite sides of a corresponding one of first column lines 102a and 102c (the source regions on the right side of the line 102a and those on the left side of the line 102c are not shown in FIGS. 2A and 2B). Therefore, source regions 16 of first load transistors Q11 adjacent to the first column line 102a are connected to the power supply connection layer 68 through contact holes 114. Similarly, source regions 18 of second load transistors Q12 adjacent to the second column line 102b are connected to the power supply connection layer 68 through contact holes 110. Therefore, the contact holes 114 and 110 are arranged in alternate relationship with one another in the cell regions in each row. Thus, power supply connection layers 68 are alternately arranged to extend in the column direction, and each of the power supply connection layers 68 is connected to the source regions of first and second load transistors Q11 and Q12 through the contact holes 110 and 114. Therefore, power source supplied from each power supply connection layer is applied to load transistors in two adjacent columns.

As described above, one of the power supply connection layer and ground connection layer is located over memory cells arranged in each column. Therefore, the width of each layer of power supply connection and ground connection may be sufficiently increased without reduction of each cell area, thereby decreasing electrical resistances of the power supply connection layer and ground connection layer.

First contact regions 25 are commonly connected to source regions 26 of first transfer transistors Qt1 and intersect with the second column line 102b. The first contact regions 25 are connected to corresponding data lines 80 (or DL) extending in the row direction through contact holes 120. In a similar manner, second contact regions 35 are commonly connected to source regions 34 of second transfer transistors Qt2 and intersect with first column lines 102a and 102c. The second contact regions 35 are connected to corresponding data lines 82 ($\overline{DL}$) extending in the row direction through contact holes 124.

Figure 7:
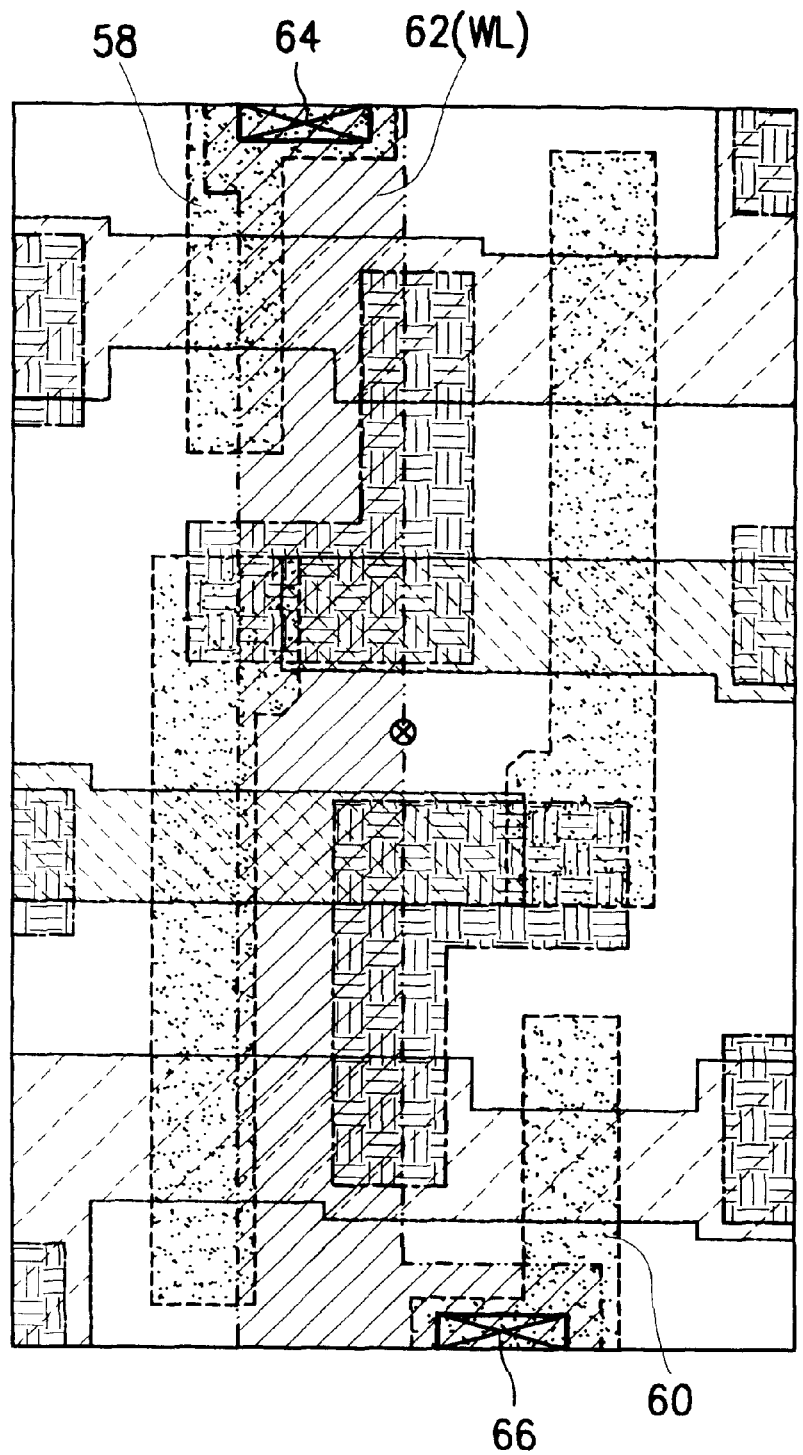
Figure 8:
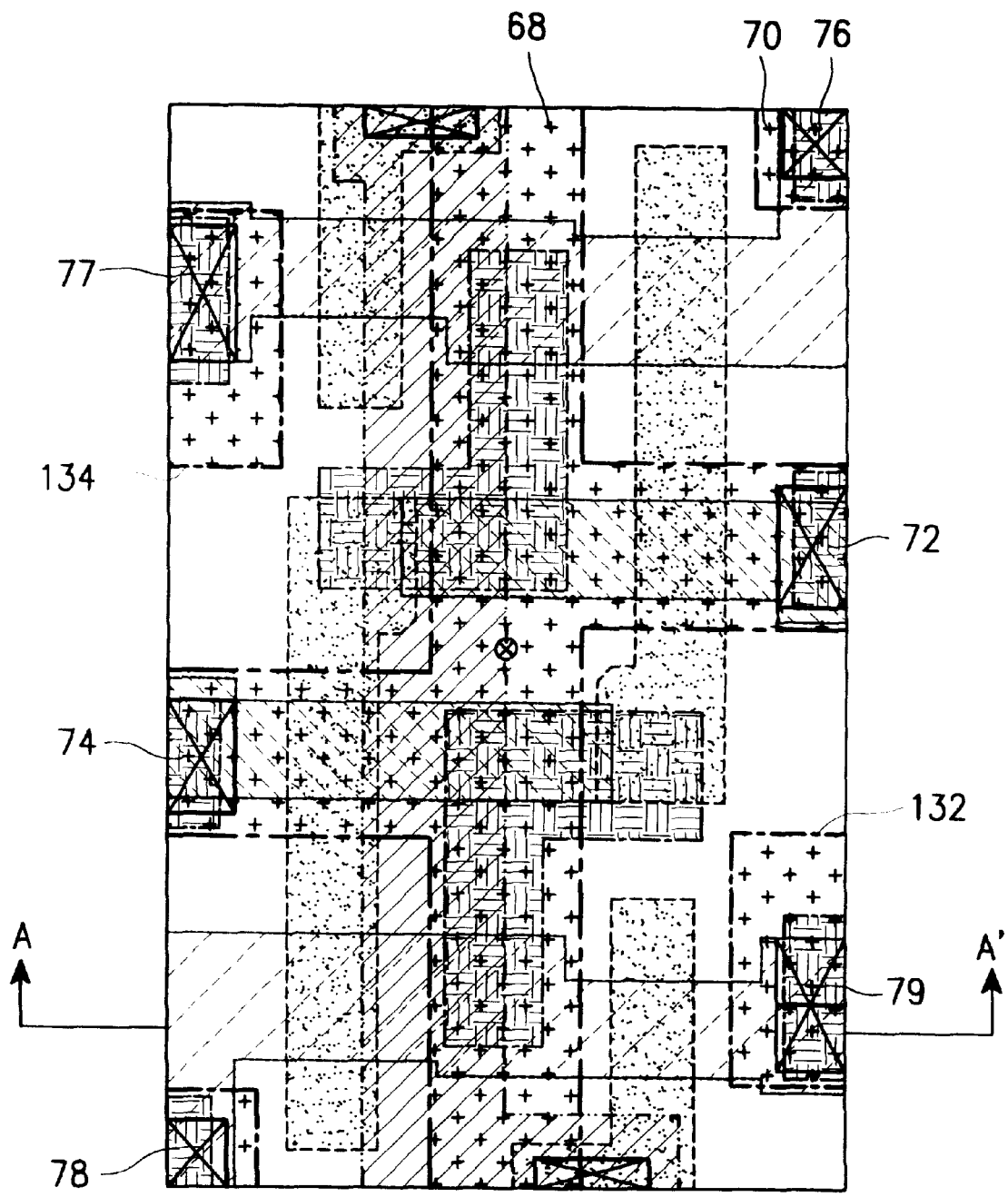
Figure 9:
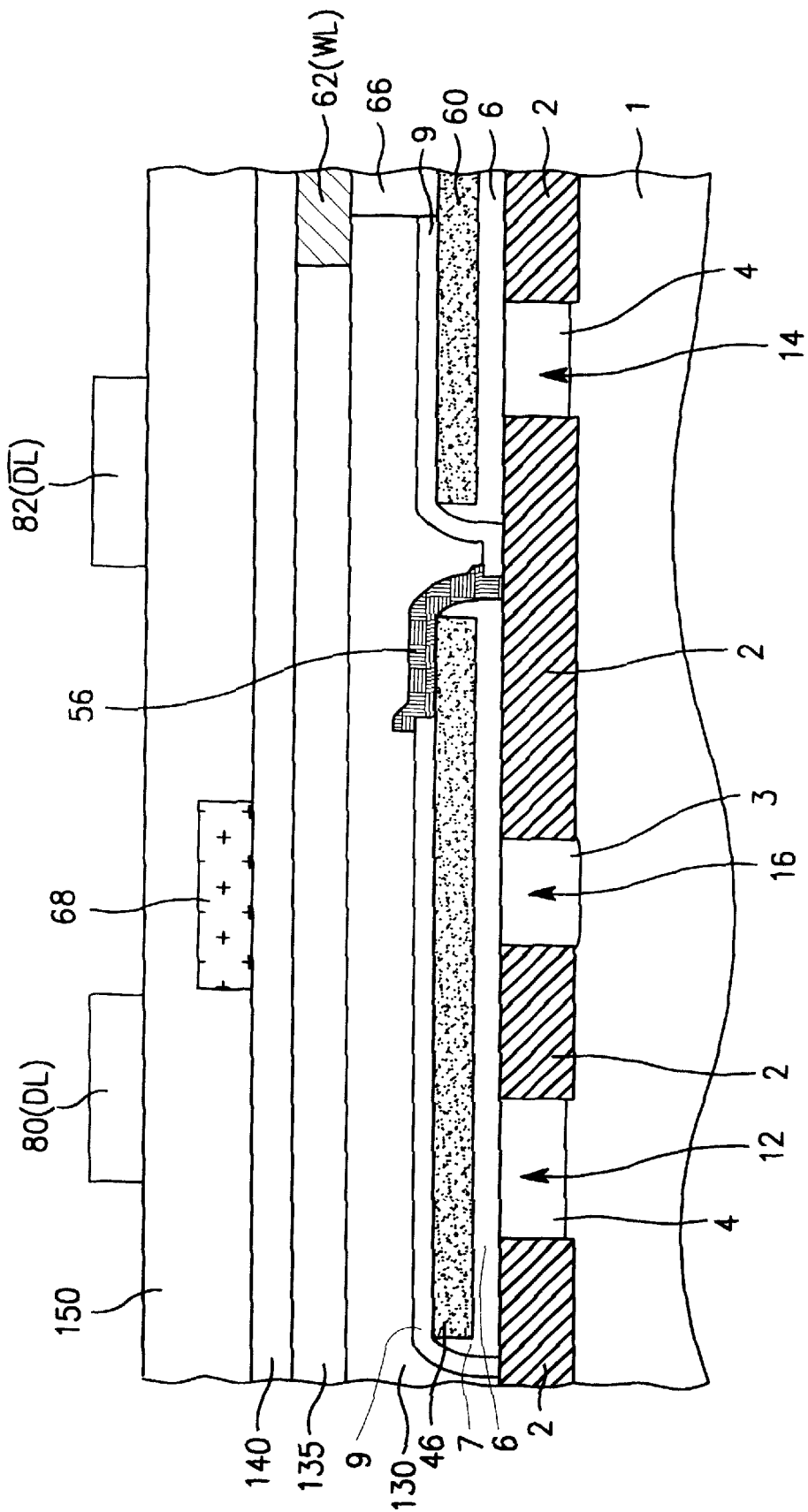
FIG. 9 is a cross-sectional view taken along a line 9–9' of FIG. 3.
Figure 10:
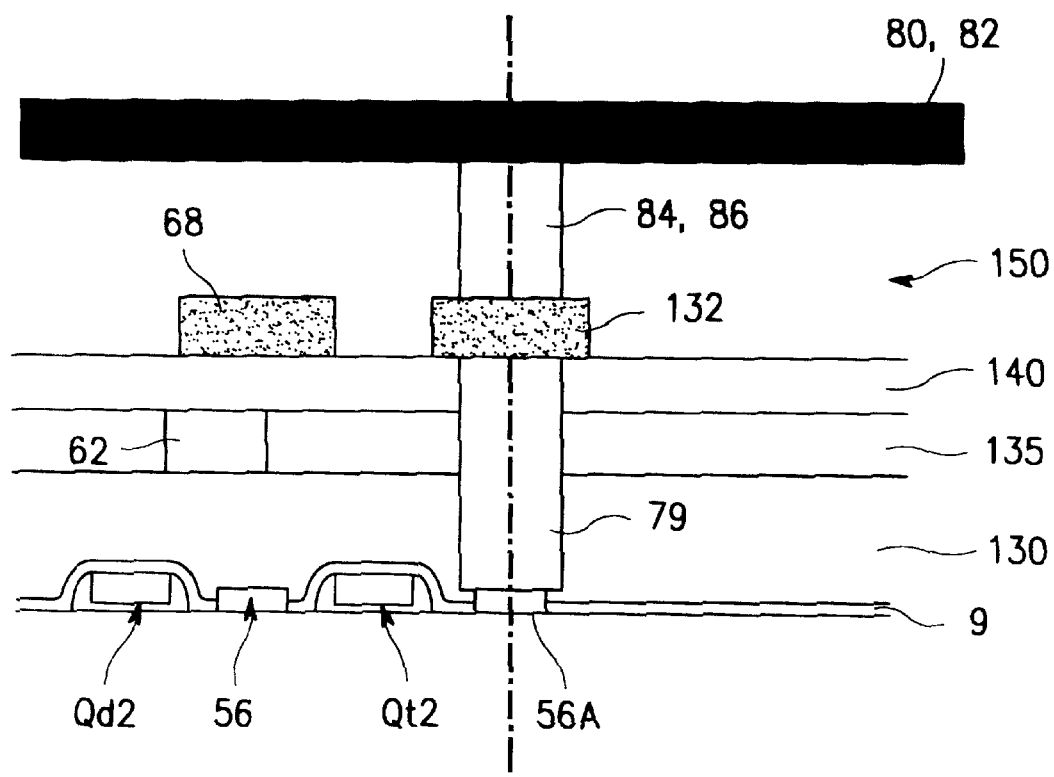
FIG. 10 is a schematic partial cross-sectional view taken along a line indicated by A–A' in FIG. 8.

Referring to FIGS. 3 to 10, a method of manufacturing the full CMOS SRAM cell according to the embodiment of the present invention will be described in detail. FIG. 9 is a cross-sectional view taken along line 9–9' of FIG. 3. FIGS. 4 to 8 are plan views showing sequential layers in processing steps of manufacturing the CMOS SRAM cell of FIG. 3. FIG. 10 is a schematic partial cross-sectional view taken along a line indicated by A–A' in FIG. 8.

Trench isolation layers 2 are formed on a surface of p-type semiconductor substrate 1 to isolate device elements by using a conventional shallow trench isolation technique. In one embodiment, the trench has a depth in the range of 0.4 to 0.6 $\mu$m. Tetraethylortho silicate $SiO_2$ is filled in the trench. The isolation layer 2 may be formed by a conventional LOCOS technique. After the formation of trench isolation layer 2, n-type and p-type wells 3 and 4 are formed. In one embodiment, the n-type well 3 having a depth of about 0.4 $\mu$m is formed by phosphorous ion implantation at an energy of 300–400 kev with a dose of about $1\times10^{13}$ ions/$cm^2$. P-type wells 4 having a depth of about 0.6 $\mu$m are formed by boron ion implantation at an energy of 170–200 kev with a dose of about $3\times10^{13}$ ions/$cm^2$.

Figure 4:
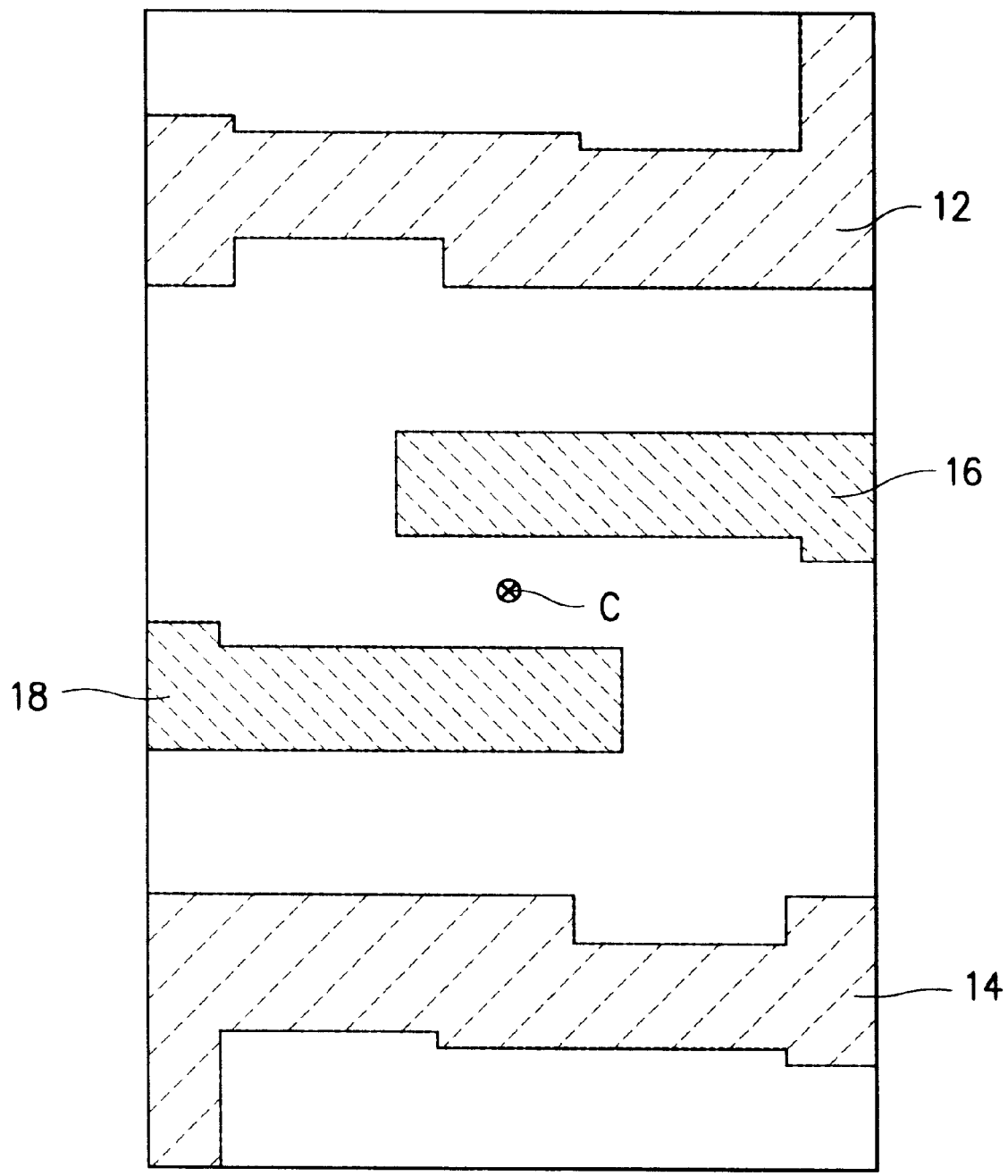
FIGS. 4 to 8 contain plan views showing sequential layers for fabricating the cell of FIG. 2.

Next, as shown in FIG. 4, first and second active regions 12 and 14 to form n-channel IGFETs are defined by trench isolation layers 2, and third and fourth active regions 16 and 18 to form p-channel IGFETs are defined by the trench isolation layers 2.

Figure 5:
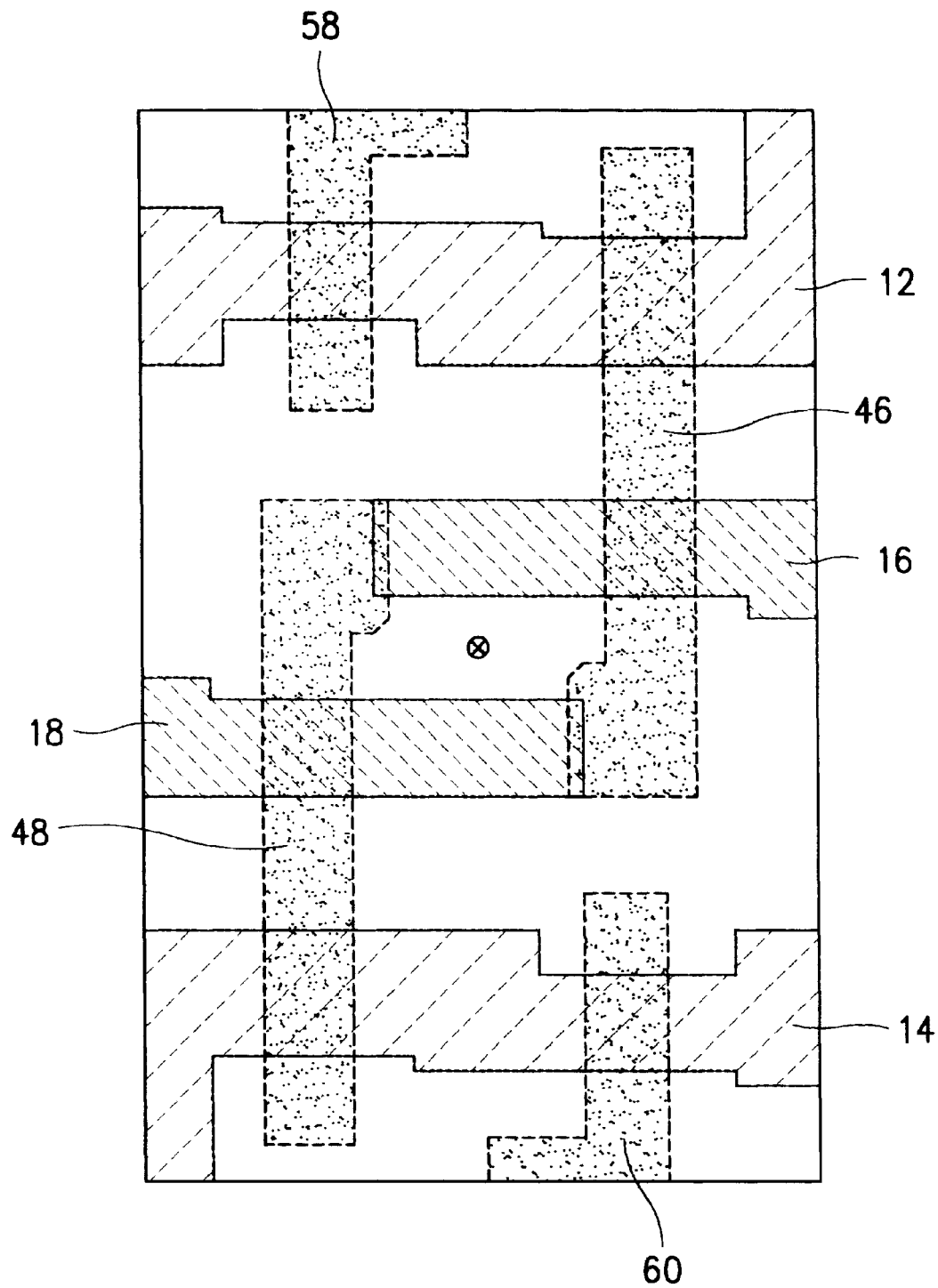
Figure 6:
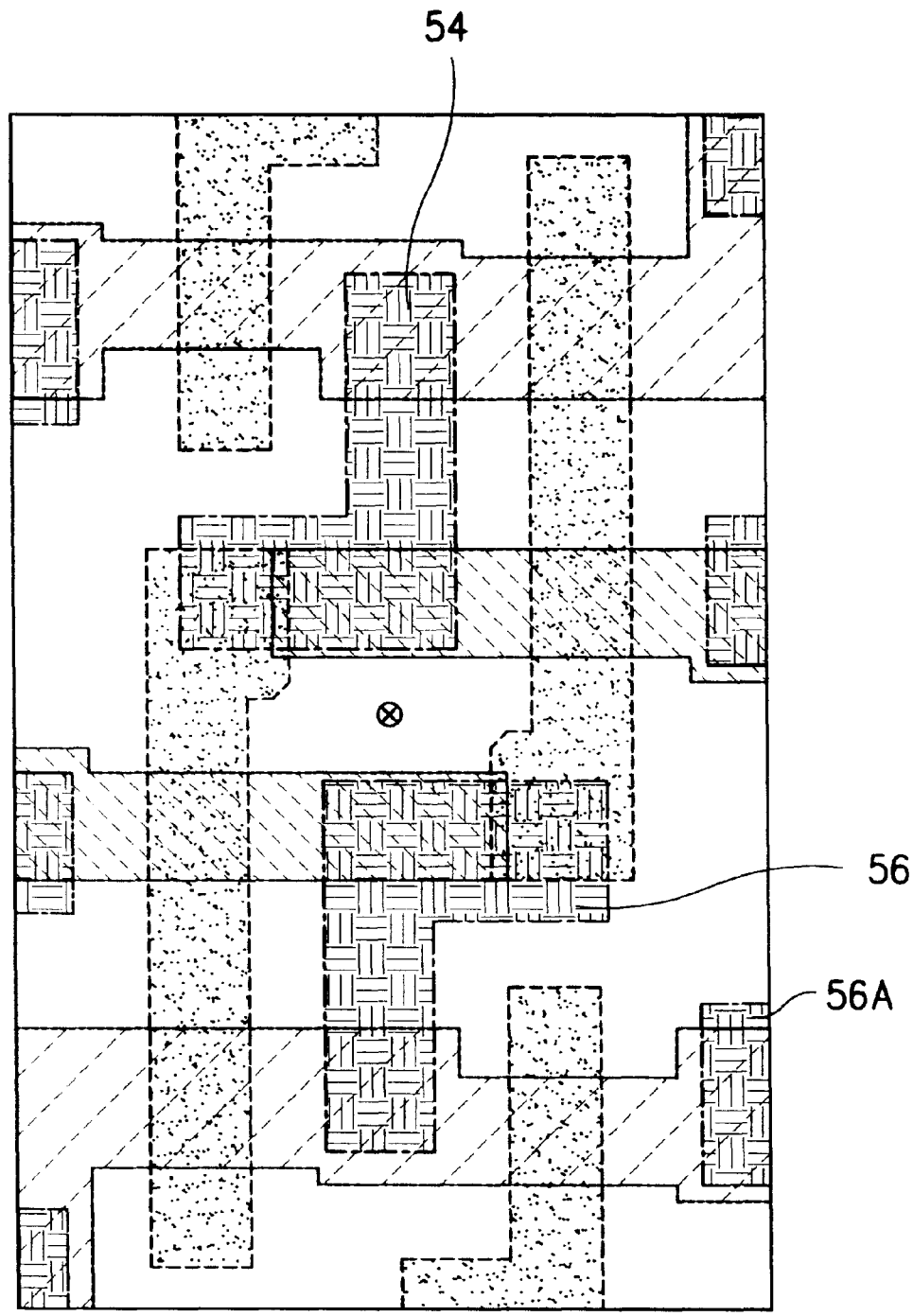

A gate oxide layer 6 is formed on the surface of the substrate with a thickness of about 60 Å. A polycrystalline layer is deposited on the gate oxide layer 6, and a pattern for gate electrode layers 46, 48, 58 and 60 is formed by a conventional photolithography technique, as shown in FIG. 5. Lightly doped source and drain regions are then formed by ion implantation of low concentration. To perform lightly doped n, i.e., n−, ion implantation, a masking layer for ion implantation is formed over third and fourth active regions 16 and 18. Arsenic ion implantation is then performed to first and second active regions 12 and 14 at an energy of 20–30 kev with a dose of $1-5\times10^{13}$ ions/$cm^2$. After removal of the masking layer, a masking layer is formed over the first and second regions 12 and 14 in order to ion-implant with p−. $BF_2$ ion implantation is then performed to the third and fourth active regions 16 and 18 at an energy of 30–40 kev with a dose of $1-5\times10^{13}$ ions/$cm^2$. After removal of the masking layer, side wall spacers 7 are formed at side walls of gate electrodes 46, 48, 58 and 60. Thereafter, ion implantation of high concentration is performed. Heavily doped p, i.e., p+, ion implantation is performed to the third and fourth active regions 16 and 18, while heavily doped n, i.e., n+, ion implantation is performed to the first and second active regions 12 and 14. The n+ ion implantation is performed at an energy of 50–70 kev with arsenic ions having a dose of $1-7\times10^{15}$ ions/$cm^2$, while the p$^+$ion implantation is performed at an energy of 50–70 kev with $BF_2$ ions having a dose of $1-7\times10^{15}$ ions/$cm^2$. A refractory metal of polycrystalline silicon layer may be formed on the heavily doped polycrystalline silicon layer. A silicon nitride layer 9 having a thickness of about 200 Å is then blanketly deposited. Thereafter, by using a borderless contact technique, first and second wiring layers 54 and 56 and contact portions for making contacts with the ground layer, power supply layer and data line layers are formed as shown in FIG. 6. As can be seen in FIG. 6, since there is no need for a border surrounded by a region connected to each of contact windows, integration density may be increased. After formation of contact windows with a conventional photolithography technique, a bilayer of Ti and TiN is deposited with a thickness of about 500 Å by sputtering, and is then patterned as shown in FIG. 6. Thereafter, first inter-level insulating layer 130, such as TEOS, is deposited on the substrate with a thickness of about 8,000 Å.

As shown in FIG. 7, contact holes 64 and 66 are formed in the first inter-level insulating layer 130 to expose underlying third and fourth gate electrode layers 58 and 60. Then, tungsten plugs are formed in the contact holes 64 and 66. Thereafter, a second insulating layer 135 is deposited with a thickness of between 3,000 and 6,000 Å. Thereafter, word lines 62 are formed by a conventional tungsten Damascene technique. Thereafter, a third inter-level insulating layer 140, such as TEOS, is deposited with a thickness of about 4,000 Å. Thereafter, as shown in FIG. 8, contact holes 72, 74, 76, 78 and 79 are formed, and tungsten plugs are formed in the contact holes. An aluminum layer is blanketly deposited with a thickness of about 6,000 Å. Contact pad layers 132 and 134 and power supply line 68, ground connection layer 70 are then formed by conventional photolithography. Layers 132 and 134 are pad layers to make contacts between active regions of the first and second transfer transistors and data lines through contact plugs 84 and 86. Thereafter, a fourth insulating layer 150, such as TEOS, is blanketly formed with a thickness of about 15,000 Å. After deposition of the insulating layer, planarization is made by a chemical mechanical polishing (CMP) technique.

Thereafter, as shown in FIG. 3, contact holes 84 and 86 are formed in order to form data lines 80 and 82. Tungsten plugs are formed in the contact holes 84 and 86. An Aluminum layer of about 6,000 Å is then blanketly deposited and then patterned to form data lines 80 and 82.

As described above, SRAM cell regions of the present invention include a plurality of pairs of first active regions extending in a row direction, a plurality of pairs of second active regions extending in the row direction so as to alternate with the pairs of first active regions, first bridge regions connecting each of the pairs of first active regions and second bridge regions connecting each of the pairs of second active regions. Each of the first bridge regions is connected to source regions of first driving transistors of four contiguous cells, and each of the second bridge regions is connected to source regions of second driving transistors of four contiguous cells. Therefore, since each of contact holes formed in the first and second bridge regions shares four contiguous cells, the number of contact holes may be reduced. On the other hand, since ground connection layers and power supply connection layers are formed over memory cells of corresponding columns, alternately extending in the column direction, the width of the ground connection layers and power supply connection layers may be increased irrespective of the reduction of memory cell size, thereby decreasing electrical resistance of each of the ground connection layers and power supply connection layers. Since each of first and second gate electrode layers does not overlap a series-connection region, i.e., common drain region, of a driving transistor and a transfer transistor, and active regions are formed in the semiconductor substrate to extend in one direction, cell size may be reduced. Since elements constituting the SRAM cell are arranged substantially symmetrical with respect to a given axis, data storage states may be stabilized.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A static random access memory cell including first and second transfer transistors of n-channel type, first and second driving transistors of the n-channel type and first and second load transistors of p-channel type, each of said transistors having source and drain regions on opposite sides of a channel region formed in a semiconductor substrate and a gate over the channel region, said cell comprising:

a first common region defined by the drain regions of said first transfer transistor and said first driving transistor connected in series therethrough;

a second common region defined by the drain regions of said second transfer transistor and said second driving transistor connected in series therethrough;

the drain region of said first load transistor disposed adjacent said first common region between said first and second common regions;

the drain region of said second load transistor disposed between the drain region of said first load transistor and said second common region;

first and second gate electrode layers disposed generally parallel to each other, said first gate electrode layer serving as the gates of said first driving transistor and said first load transistor and said second gate electrode layer serving as the gates of said second driving transistor and said second load transistor, each of said first and second gate electrode layers being made of a conductive material at a first level of said memory; and first and second interconnecting layers each made of a conductive material at a second level of said memory cell different from said first level, said first interconnecting layer connecting said first common region to the drain region of said first load transistor and to said second gate electrode layer, said second interconnecting layer connecting said second common region to the drain region of said second load transistor and to said first gate electrode layer.

2. The memory cell as recited in claim 1, further comprising:

isolation regions formed in said substrate;

first and second active regions separately formed in said substrate so as to be isolated by said isolation regions, each of said first and second active regions extending in a first direction, said first active region providing the source and channel regions and said first common region of said first transfer transistor and said first driving transistor, said second active region providing the source and channel regions and said second common region of said second transfer transistor and said second driving transistor;

third and fourth active regions separately formed in said substrate so as to be isolated by said isolation regions, said third active region extending from said drain region of said first load transistor in the first direction to provide the drain, channel and source regions thereof, said fourth active region extending to said drain region of said second load transistor in the first direction to provide the source, channel and drain regions thereof.

3. The memory cell as recited in claim 2, wherein each of said first and second active regions is a p-type well region formed in said substrate and each of said third and fourth regions is an n-type well region formed in said substrate.

4. The memory cell as recited in claim 2, wherein said first and second gate electrode layers extend in a second direction generally perpendicular to said first direction, one end portion of said first gate electrode layer being adjacent to said drain region of said second load transistor and one end portion of said second gate electrode layer being adjacent to said drain region of said first load transistor.

5. The memory cell as recited in claim 1, wherein said first transfer transistor, said first driving transistor and said first load transistor are respectively disposed generally symmetrically with said second transfer transistor, said second driving transistor and said second load transistor relative to a certain axis in said substrate.

6. The memory cell as recited in claim 1, wherein said first gate electrode layer is disposed generally symmetrically with said second gate electrode layer relative to said certain axis.

7. The memory cell as recited in claim 6, wherein said first interconnecting layer is disposed generally symmetrically with said second interconnecting layer relative to said certain axis.

8. The memory cell as recited in claim 2, wherein said first and second transfer transistors, said first and second driving transistors and said first and second load transistors are respectively disposed generally symmetrically in said substrate.

9. The memory cell as recited in claim 8, wherein said first and second gate electrode layers are disposed generally symmetrically in said substrate.

10. The memory cell as recited in claim 9, wherein said first and second interconnecting layers are disposed generally symmetrically in said substrate.

11. A semiconductor memory device including at least one memory cell disposed in a cell region defined on a semiconductor substrate, said cell including first and second transfer transistors, first and second driving transistors and first and second load transistors each of which has a pair of source/drain regions on opposite sides of a channel region in said substrate and a gate over the channel region, one of the source/drain regions of said first transfer transistor being connected in series with one of the source/drain regions of said first driving transistor for providing a first common region, one of the source/drain regions of said second transfer transistor being connected in series with one of the source/drain regions of said second driving transistor for providing a second common region, said first common region being connected to one of the source/drain regions of said first load transistor and to the gates of said second load transistor and said second driving transistor, said second common region being connected to one of the source/drain regions of said second load transistor and to the gates of said first load transistor and said first driving transistor, the other of the source/drain regions of each of said first and second transfer transistors being connected to a corresponding one of a pair of data lines, the improvement of said device comprising:

a first active region formed in said substrate in said cell region and extending in a first direction to provide the others of the source/drain regions of said first transfer transistor and said first driving transistor, the channel regions thereof and said first common region; and a second active region formed spaced apart from said first active region in said substrate in said cell region and extending in said first direction to provide the others of the source/drain regions of said second transfer transistor and said second driving transistor, the channel regions thereof and said second common region.

12. The device as recited in claim 11, further comprising:

a third active region formed in said substrate in said cell region and disposed adjacent said first active region between said first and second active regions, extending in said first direction to provide the source/drain regions and the channel region of said first load transistor; and a fourth active region formed in said substrate in said cell region and disposed adjacent said second active region between said first and second active regions, extending in said first direction to provide the source/drain regions and the channel region of said second load transistor.

13. The device as recited in claim 11, wherein said cell region is a generally rectangular-shaped region having first and second edges substantially parallel to a second direction substantially perpendicular to said first direction and third and fourth edges substantially parallel to said first direction, a first end portion of the other of the source/drain regions of said first driving transistor being contiguous to said first edge, and a second end portion of the other of the source/drain regions of said second driving transistor being contiguous to said second edge.

14. The device as recited in claim 13, further comprising:

a first bridge region formed in said substrate in said cell region and extending to said third edge adjacent said first active region along said first edge from said first end portion; and a second bridge region formed in said substrate in said cell region and extending to said fourth edge adjacent said second active region along said second edge from said second end portion.

15. The device as recited in claim 13, further comprising a ground connection layer formed on an insulating layer over said cell region and connected to said first and second bridge regions underlying said insulating layer through contact holes.

16. The device as recited in claim 12, wherein said cell region is a generally rectangular-shaped region having first and second edges substantially parallel to a second direction substantially perpendicular to said first direction and third and fourth edges substantially parallel to said first direction, a first end portion of the other of the source/drain regions of said first driving transistor being contiguous to said first edge, a second end portion of the other of the source/drain regions of said second driving transistor being contiguous to said second edge, a third end portion of the other of the source/drain regions of said first load transistor being contiguous to said first edge, and a fourth end portion of the other of the source/drain regions of said second load transistor being contiguous to said second edge.

17. The device as recited in claim 16, further comprising:

a first bridge region formed in said substrate in said cell region and extending to said third edge adjacent said first active region along said first edge from said first end portion; and a second bridge region formed in said substrate in said cell region and extending to said fourth edge adjacent said second active region along said second edge from said second end portion.

18. The device as recited in claim 17, further comprising:

one of a ground connection layer and a power supply connection layer formed on an insulating layer over said cell region, said ground connection layer being connected to said first and second bridge regions through contact holes in said insulating layer, said power supply connection layer being connected to said third and fourth end portions through contact holes in said insulating layer.

19. A semiconductor device including memory cells respectively formed in cell regions on a semiconductor substrate, said cell regions defined by row and column lines bounding respective ones of said cell regions, said row lines divided into alternate first and second row lines, said column lines divided into alternate first and second column lines, each of said cells including a flip-flop with cross-coupled first and second inverters, and first and second transfer transistors connected to said flip-flop, said first and second inverters respectively having first and second diffusion regions in said substrate to be connected to a ground source, said device comprising:

first bridge regions formed in said substrate such that each of said first bridge regions is interconnected through a corresponding one of intersections of said first row lines and said first column lines with said first diffusion region in each of four cell regions contiguous to said corresponding one of the intersections thereof; and second bridge regions formed in said substrate such that each of said second bridge regions is interconnected through a corresponding one of intersections of said second row lines and said second column lines with said second diffusion region in each of four cell regions contiguous to said corresponding one of the intersections thereof; whereby said second bridge regions crossing each of said second row lines are arranged in a staggered relationship with respect to said first bridge regions crossing each of two first row lines adjacent to said each of said second row lines.

20. The semiconductor device as recited in claim 19, wherein said first diffusion region of each cell is a source region of a first driving transistor of an n-channel type constituting said first inverter and said second diffusion region of each cell is a source region of a second driving transistor of said n-channel type constituting said second inverter.

21. The semiconductor device as recited in claim 19, wherein said first and second inverters of each cell respectively include third and fourth diffusion regions formed in said substrate to be connected to a power supply source, said third diffusion regions in said cell regions contiguous to each of said first column lines being disposed in rectilinear relationships generally parallel in a row direction on opposite sides of each of said first column lines, and said fourth diffusion regions in said cell regions contiguous to each of said second column lines being disposed in rectilinear relationships generally parallel in the row direction on opposite sides of each of said second column lines.

22. The semiconductor device as recited in claim 21, said device further comprising:

ground layers each extending in a column direction on an insulating layer over said memory cells arranged in each of alternating columns and connected to said first and second bridge regions via contact holes in said insulating layer for supplying said ground source; and power supply layers each extending in the column direction on said insulating layer over said memory cells arranged in each column between said alternating columns and connected to said third and fourth diffusion regions via contact holes in said insulating layer for supplying said power supply source.

23. The semiconductor device as recited in claim 22, wherein said contact holes for supplying said ground source are disposed at said intersections and said contact holes for supplying said power source are disposed at portions on said first column lines intersecting with said rectilinear third diffusion regions and on said second column lines intersecting with said rectilinear fourth diffusion region.

* * * * *